(12) United States Patent
Lee

(10) Patent No.: US 10,748,633 B2
(45) Date of Patent: Aug. 18, 2020

(54) SEMICONDUCTOR MEMORY DEVICE

(71) Applicant: SK hynix Inc., Gyeonggi-do (KR)

(72) Inventor: Won Hee Lee, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/684,203

(22) Filed: Nov. 14, 2019

(65) Prior Publication Data
US 2020/0082892 A1 Mar. 12, 2020

Related U.S. Application Data

(62) Division of application No. 15/298,028, filed on Oct. 19, 2016, now Pat. No. 10,510,424.

(30) Foreign Application Priority Data

May 4, 2016 (KR) .................. 10-2016-0055523

(51) Int. Cl.
*G11C 16/34* (2006.01)
*G11C 16/10* (2006.01)
*G11C 16/26* (2006.01)
*G11C 16/24* (2006.01)
*G11C 16/08* (2006.01)
*G11C 7/24* (2006.01)

(52) U.S. Cl.
CPC ........... *G11C 16/3459* (2013.01); *G11C 7/24* (2013.01); *G11C 16/08* (2013.01); *G11C 16/10* (2013.01); *G11C 16/24* (2013.01); *G11C 16/26* (2013.01)

(58) Field of Classification Search
None
See application file for complete search history.

(56) References Cited

U.S. PATENT DOCUMENTS 7,551,477 B2 6/2009 Mokhlesi et al.
2007/0140010 A1 6/2007 Yeh et al.
(Continued)

FOREIGN PATENT DOCUMENTS

CN 101866694 A 10/2010
CN 105405464 A 3/2013

OTHER PUBLICATIONS

Office Action issued by China National Intellectual Property Administration dated Mar. 4, 2020.
(Continued)

*Primary Examiner* — James G Norman
(74) *Attorney, Agent, or Firm* — IP & T Group LLP

(57) ABSTRACT

Provided herein is a semiconductor memory device. The semiconductor memory device may include: a memory cell array including a plurality of pages; a voltage supply unit configured to provide operating voltages to the plurality of pages; a plurality of page buffers coupled to a plurality of bit lines of the memory cell array and configured to control and sense currents flowing through the plurality of bit lines in response to a page buffer sensing signal; and a control logic configured to control the voltage supply unit and the plurality of page buffers such that the plurality of pages are successively programmed, and to control a potential level of the page buffer sensing signal depending on a program sequence of the plurality of pages during a program verify operation of a program operation.

6 Claims, 8 Drawing Sheets

(56) References Cited

U.S. PATENT DOCUMENTS

| | | |
|---|---|---|
| 2008/0205160 A1 | 8/2008 | Kim et al. |
| 2010/0302852 A1 | 12/2010 | Oh |
| 2012/0099391 A1* | 4/2012 | Park .................. G11C 16/26 365/203 |
| 2012/0230103 A1 | 9/2012 | Choe et al. |
| 2015/0279472 A1 | 10/2015 | Jones |

OTHER PUBLICATIONS

Notice of Allowance issued by USPTO for U.S. Appl. No. 16/684,178 in the same family tree dated Jan. 29, 2020.

* cited by examiner

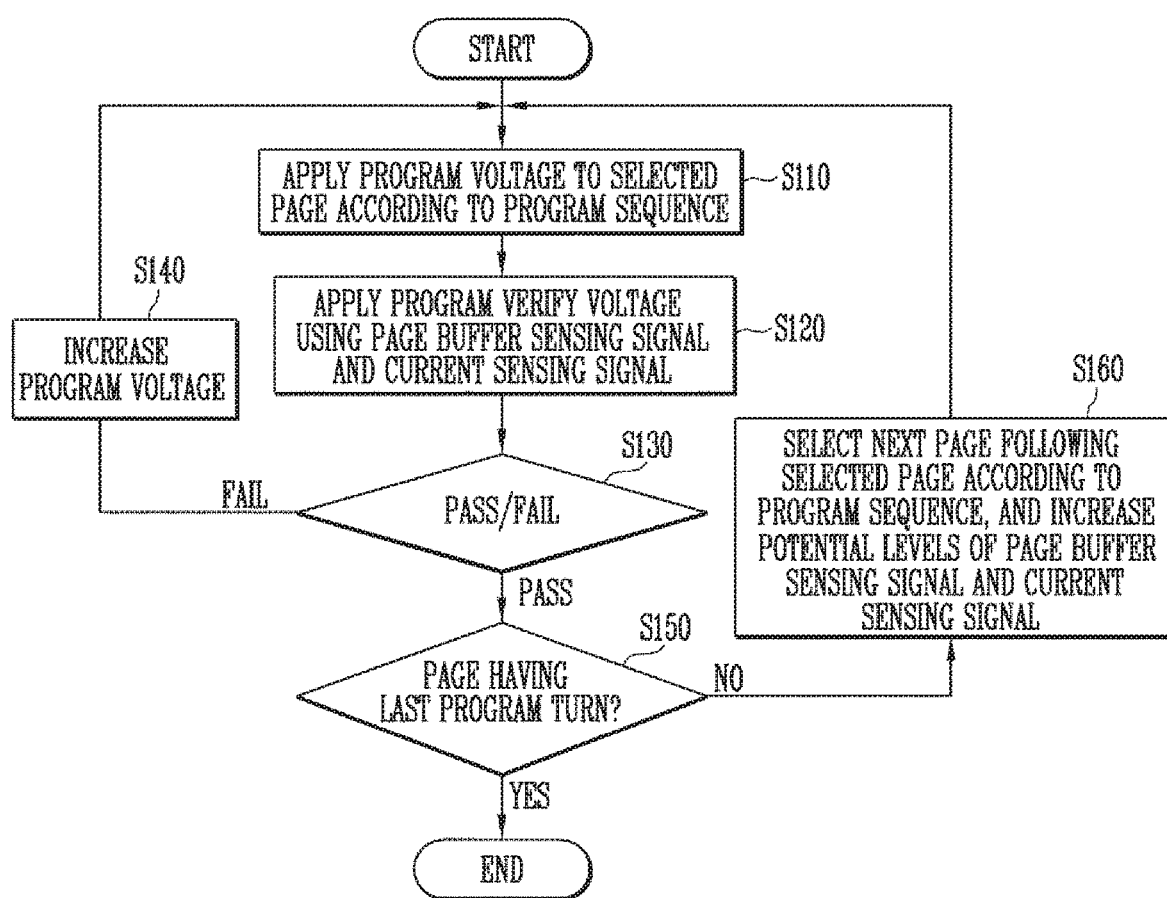

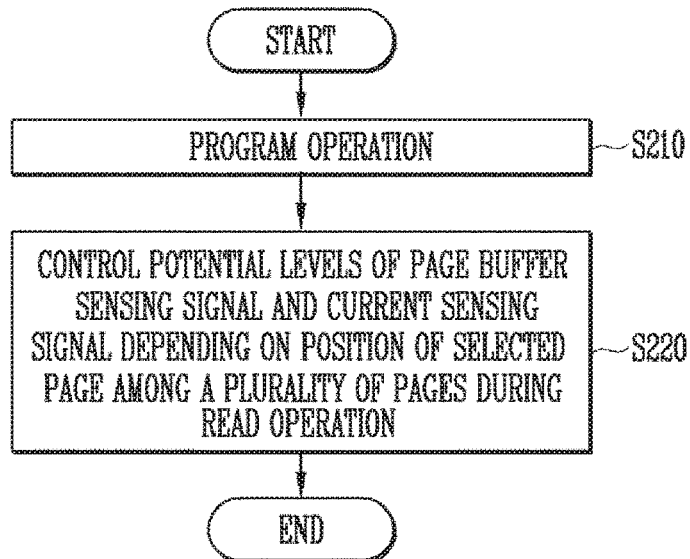
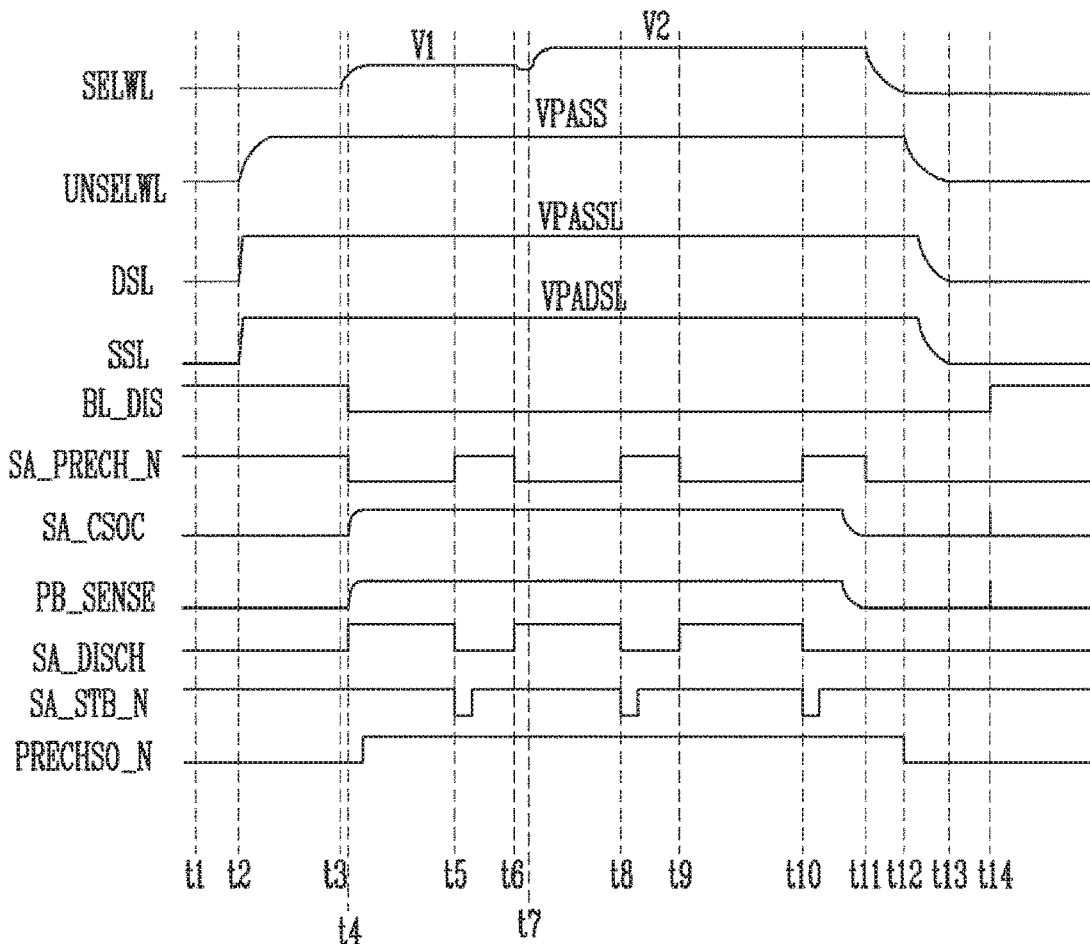

SEMICONDUCTOR MEMORY DEVICE

CROSS-REFERENCE TO RELATED APPLICATION

This application is a division of U.S. patent application Ser. No. 15/298,028 filed on Oct. 19, 2016, which claims benefits of priority of Korean Patent Application No. 10-2016-0055523 filed on May 4, 2016. The disclosure of each of the foregoing application is incorporated herein by reference in its entirety.

BACKGROUND

Field of Invention

Various embodiments of present invention relate generally to a semiconductor electronic device and, more particularly, to a semiconductor memory device.

Description of Related Art

Semiconductor devices, in particular, semiconductor memory devices are classified into volatile memory devices and nonvolatile memory devices.

A nonvolatile memory device can maintain data stored therein even when a supply of power is interrupted, although read and write speeds are comparatively low. Therefore, a nonvolatile memory device is typically used when there is a need for storing data which must be maintained regardless of the state of the power supply to the memory device. Representative examples of a nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. A flash memory is classified into a NOR and NAND memory.

A flash memory combines both advantages of a RAM in which data is programmable and erasable, and advantages of a ROM in which data stored therein can be retained even when power is interrupted. A flash memory is widely used as a storage medium for portable electronic devices such as a digital camera, a personal digital assistant (PDA) and MP3.

SUMMARY

Various embodiments of the present invention are directed to a semiconductor memory device which improve differences in current characteristics of memory cells during a program verify operation and a read operation, thus enhancing the reliability of the operations.

One embodiment of the present disclosure provides a semiconductor memory device including: a memory cell array including a plurality of pages; a voltage supply unit configured to provide operating voltages to the plurality of pages; a plurality of page buffers coupled to a plurality of bit lines of the memory cell array and configured to control and sense currents flowing through the plurality of bit lines in response to a page buffer sensing signal; and a control logic configured to control the voltage supply unit and the plurality of page buffers such that the plurality of pages are successively programmed, and to control a potential level of the page buffer sensing signal according to a program sequence of the plurality of pages during a program verify operation of a program operation.

Another embodiment of the present disclosure provides a semiconductor memory device including: a memory cell array including a plurality of pages; a voltage supply unit configured to provide operating voltages to the plurality of pages; a plurality of page buffers coupled to a plurality of bit lines of the memory cell array and configured to control and sense currents flowing through the plurality of bit lines in response to a page buffer sensing signal; and a control logic configured to control, during a read operation, the potential level of the page buffer sensing signal depending on a position of a selected page among the plurality of pages.

Another embodiment of the present disclosure provides a semiconductor memory device including: a memory cell array including a plurality of pages; a voltage supply unit configured to provide operating voltages to the plurality of pages; a plurality of page buffers coupled to a plurality of bit lines of the memory cell array and configured to control and sense currents flowing through the plurality of bit lines in response to a page buffer sensing signal; and a control logic configured to control a potential level of the page buffer sensing signal depending on a temperature of the memory cell array.

BRIEF DESCRIPTION OF THE DRAWINGS

Example embodiments will now be described more fully hereinafter with reference to the accompanying drawings in which:

FIG. 4 is a flowchart illustrating a program operation of the semiconductor memory device, according to an embodiment of the present invention;

FIG. 5 is a flowchart illustrating a program operation and a read operation of the semiconductor memory device, according to an embodiment of the present invention;

FIG. 6 is a timing diagram illustrating in detail an operating method of the page buffer illustrated in FIG. 3;

DETAILED DESCRIPTION

Figure 1:
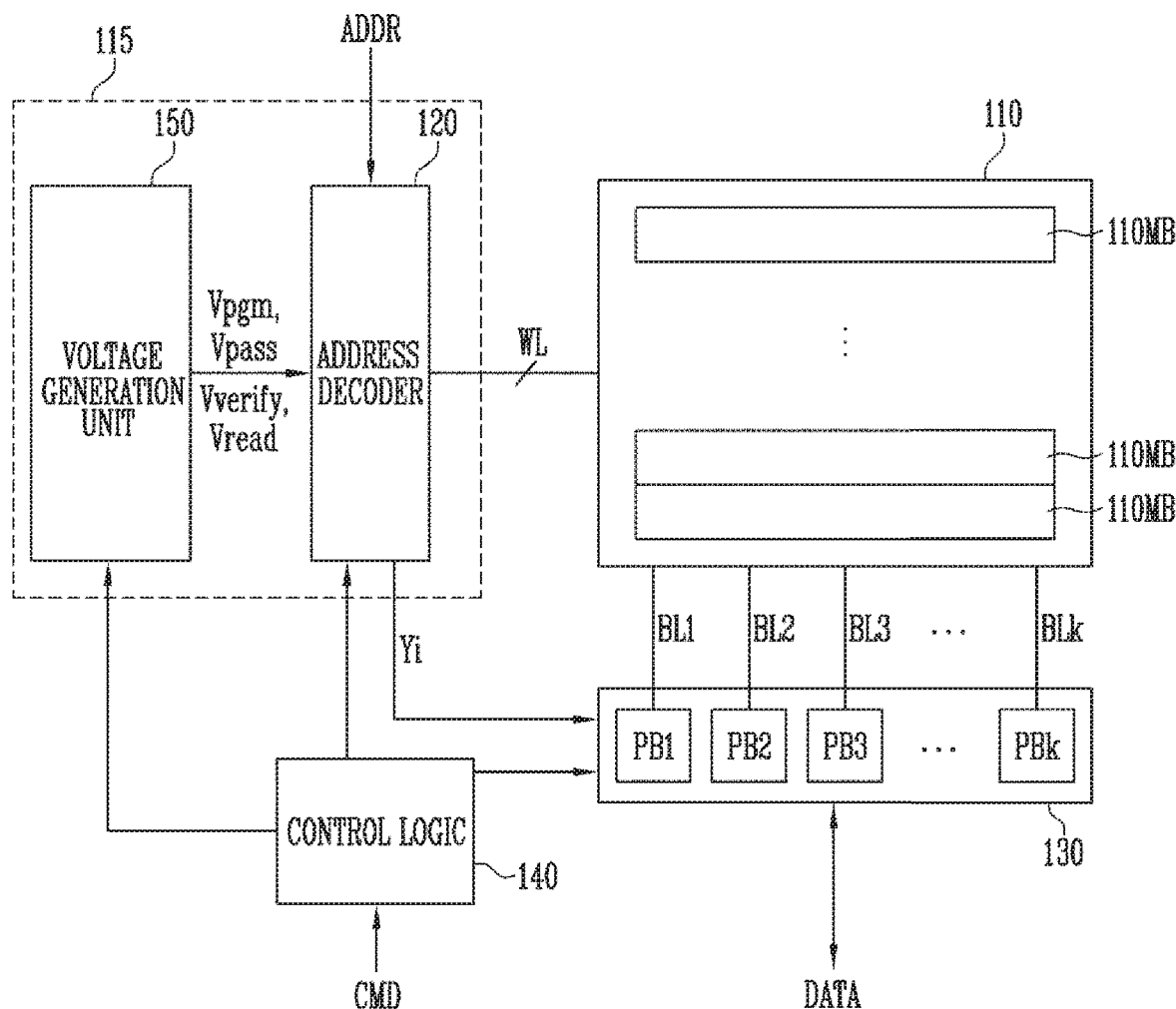
FIG. 1 is a block diagram illustrating a semiconductor memory device, according to an embodiment of the present invention.

Hereinafter, embodiments of the present invention will be described in greater detail with reference to the accompanying drawings. However, we note that the present invention may be embodied in different other forms and should not be construed as being limited only to the embodiments set forth herein. Rather, these embodiments are provided so that this disclosure will be thorough and complete, and will fully convey the scope of the example embodiments to those skilled in the art.

We note, that the embodiments are described herein with reference to simplified schematic illustrations of the embodiments and intermediate structures. As such, variations from the shapes of the illustrations as a result, for example, of manufacturing techniques and/or tolerances, are to be expected. Thus, the embodiments should not be construed as being limited to the particular shapes and sizes illustrated herein but may include deviations in shapes that result, for example, from manufacturing. Moreover, in the drawings, lengths and sizes of the various elements layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present invention. Furthermore, 'and/or' may include any one of or a combination of the components mentioned.

Furthermore, a singular form may include a plural from as long as it is not specifically mentioned in a sentence. It is also noted that in this specification, "connected/coupled" refers to one component not only directly coupling another component but also indirectly coupling another component through an intermediate component. Furthermore, "directly connected/directly coupled" refers to one component directly coupling another component without an intermediate component.

The terminology used herein is for the purpose of describing particular embodiments only and is not intended to be limiting of the present invention.

It will be further understood that the terms "comprises", "comprising", "includes", and "including" when used in this specification, specify the presence of the stated elements and do not preclude the presence or addition of one or more other elements.

Unless otherwise defined, all terms including technical and scientific terms used herein have the same meaning as commonly understood by one of ordinary skill in the art to which the present invention belongs in view of present invention. It will be further understood that terms, such as those defined in commonly used dictionaries, should be interpreted as having a meaning that is consistent with their meaning in the context of present invention and the relevant art, and will not be interpreted in an idealized or overly formal sense unless expressly so defined herein.

In the following description, numerous specific details are set forth to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element also referred to as a feature described in connection with one embodiment may be used singly or in combination with other elements of another embodiment, unless specifically indicated otherwise.

Hereinafter, the various embodiments of the present invention will be described in detail with reference to the attached drawings.

FIG. 1 is a block diagram illustrating a semiconductor memory device, according to an embodiment of the present invention.

Referring to FIG. 1, the semiconductor memory device 100 includes a memory cell array 110, peripheral circuits 120, 130 and 150, and a control logic 140. The peripheral circuits 120, 130 and 150 include a voltage supply unit 115 and a page buffer circuit 130. The voltage supply unit 115 includes an address decoder 120 and a voltage generation unit 150.

The memory cell array 110 includes a plurality of memory blocks 110MB. The plurality of memory blocks 110MB are coupled to the address decoder 120 through a plurality of word lines WL. The plurality of memory blocks 110MB are coupled to the page buffer circuit 130 through a plurality of bit lines BL1 to BLk. Each of the memory blocks 110MB includes a plurality of memory cells. In an embodiment, the plurality of memory cells may be nonvolatile memory cells. Memory cells coupled to the same word line among the plurality of memory cells are defined as one page. The memory cell array 110 may be configured with a plurality of pages in each block.

In addition, each of the memory blocks 110MB of the memory cell array 110 includes a plurality of cell strings. Each of the cell strings includes a drain select transistor, a plurality of memory cells, and a source select transistor which are coupled in series between a bit line and a source line.

The address decoder 120 is coupled to the memory cell array 110 through the plurality of word lines WL. The address decoder 120 is configured to operate in response to the control of the control logic 140. The address decoder 120 may receive addresses ADDR from an external device, such as a host (not shown), through an input/output buffer (not shown) provided in the semiconductor memory device 100.

The address decoder 120 decodes a row address of the received addresses ADDR and applies a program voltage Vpgm, a pass voltage Vpass, a program verify voltage Vverify, a read voltage Vread and a plurality of operation voltages which are generated from the voltage generation unit 150, to the memory cells and the drain and source select transistors of the memory cell array 110 in accordance with the decoded row address.

The address decoder 120 is configured to decode a column address Yi among the received addresses ADDR during a program operation or a read operation. The address decoder 120 transmits the decoded column address Yi to the page buffer circuit 130.

Addresses ADDR received in a request for a program operation or a read operation include a block address, a row address, and a column address Yi. The address decoder 120 selects one memory block according to the block address and the column address and then selects the plurality of word lines WL together or one word line. The column address Yi is decoded by the address decoder 120 and provided to the page buffer circuit 130.

The page buffer circuit 130 includes a plurality of page buffers PB1 to PBk. The plurality of page buffers PB1 to PBk are coupled to the memory cell array 110 through the plurality of bit lines BL1 to BLk. Each of the page buffers PB1 to PBk temporarily stores program data to be inputted from the outside during the program operation and controls a potential of a corresponding one of the bit lines BL1 to BLk in accordance with the temporarily stored program data. The page buffer circuit 130 operates in response to the control of the control logic 140.

Furthermore, during a program verify operation, the page buffers PB1 to PBk sense currents of the corresponding bit lines BL1 to BLk and perform a program verify operation for the memory cells.

During a read operation, the page buffers PB1 to PBk sense currents of the corresponding bit lines BL1 to BLk and read data stored in the memory cells.

The control logic 140 is coupled to the address decoder 120, the page buffer circuit 130, and the voltage generation unit 150. The control logic 140 receives a command CMD from an external device such as a host. The control logic 140 may receive a command CMD from an external device such as a host through an input/output buffer (not shown) of the semiconductor memory device 100. The control logic 140 is configured to control the overall operation of the semiconductor memory device 100 in response to the command CMD.

According to the present invention, the control logic 140 may perform a program or a read operation on a page basis. The control logic 140 may control the peripheral circuits 120, 130 and 150 so as to successively program or read a plurality of pages.

During a program verify operation of a program operation, the control logic 140 may control the potential levels of page buffer sensing signals and current sensing signals to be applied to the respective page buffers PB1 to PBk depending on a program sequence of the plurality of pages. For example, during a program verify operation, the control logic 140 may control, depending on a program sequence of a selected page, the potential levels of page buffer sensing signals and current sensing signals, so that, the later in the program sequence the selected page is, the higher the potential levels of the page buffer sensing signals and the current sensing signals are. The control logic 140 may then output the potential levels to the respective page buffers PB1 to PBk.

During a read operation, the control logic 140 may control the potential levels of page buffer sensing signals and current sensing signals to be applied to the respective page buffers PB1 to PBk depending on the physical position of a selected page of the plurality of pages. For example, the control logic 140 may control the potential levels of page buffer sensing signals and current sensing signals to be applied to the respective page buffers PB1 to PBk so that, the closer the physical position of a selected page is to the drain select transistor, the lower the potential levels are, and, the closer the position of the selected page is to the source select transistor, the higher the potential levels are.

Furthermore, during a program verify operation or a read operation, the control logic 140 may control the enable periods of the page buffer sensing signals, current sensing signals and sense-amplifier strobe signals to be applied to be respective page buffers PB1 to PBk. For example, during a program verify operation, the control logic 140 may control the enable periods of page buffer sensing signals, current sensing signals and sense-amplifier strobe signals depending on a program sequence of a selected page. In more detail, during a program verify operation, the later in the program sequence the selected page is, the more the control logic 140 may increase the duration of the enable periods of the page buffer sensing signals and the current sensing signals. During a read operation, the control logic 140 may control the enable periods of page buffer sensing signals, current sensing signals and sense-amplifier strobe signals depending on the physical position of a selected page. For example, during a read operation, the closer the position of the selected page is to the drain select transistor, the shorter in duration the enable periods of the page buffer sensing signals and current sensing signals may be.

During a bit line precharge operation of a program verify operation, the control logic 140 may control the potential levels of the page buffer sensing signals and the current sensing signals to be applied to the respective page buffers PB1 to PBk depending on a program sequence of a selected page.

Furthermore, during a bit line precharge operation of a program verify operation, the control logic 140 may control the enable periods of the page buffer sensing signals and the current sensing signals to be applied to the respective page buffers PB1 to PBk.

For example, during a bit line precharge operation of a program verify operation, the control logic 140 may control the page buffer sensing signals and current sensing signals so that, the later in a program sequence the selected page is, the higher the potential levels of the page buffer sensing signals and current sensing signals are, or the greater the duration of the enable periods thereof are. In this case, the potential levels and the enable periods may be controlled together.

In addition, during a bit line precharge operation of the read operation, the control logic 140 may control the potential levels of the page buffer sensing signals and the current sensing signals to be applied to the respective page buffers PB1 to PBk depending on the position of a selected page. Furthermore, during the bit line precharge operation of the read operation, the control logic 140 may control the enable periods of the page buffer sensing signals and the current sensing signals to be applied to the respective page buffers PB1 to PBk.

For example, the control logic 140 may control the page buffer sensing signals and the current sensing signals so that the closer the position of the selected page is to the drain select transistor, the lower the potential levels of the page buffer sensing signals and the current sensing signals are, or the shorter in duration the enable periods thereof are. In this case, the potential levels and the enable periods may be controlled together.

During a program verify operation or read operation, the control logic 140 may control the potential levels of page buffer sensing signals and current sensing signals to be applied to the respective page buffers PB1 to PBk depending on the temperature of the memory cell array 110. For example, during the program verify operation or read operation, the control logic 140 may control the potential levels of the page buffer sensing signals and current sensing signals to be applied to the respective page buffers PB1 to PBk so that, as the temperature of the memory cell array 110 reduces, the potential levels are raised, and, as the temperature of the memory cell array 110 increases, the potential levels are lowered.

Furthermore, the control logic 140 may control an enable period of sense-amplifier strobe signals so that it is increased or reduced depending on the temperature of the memory cell array 110.

The above-mentioned page buffer sensing signals, current sensing signals and sense-amplifier strobe signals will be described in more detail later herein.

The voltage generation unit 150 generates and outputs a plurality of operating voltages Vpgm, Vverify, Vpass and Vread under the control of the control logic 140.

Figure 2:
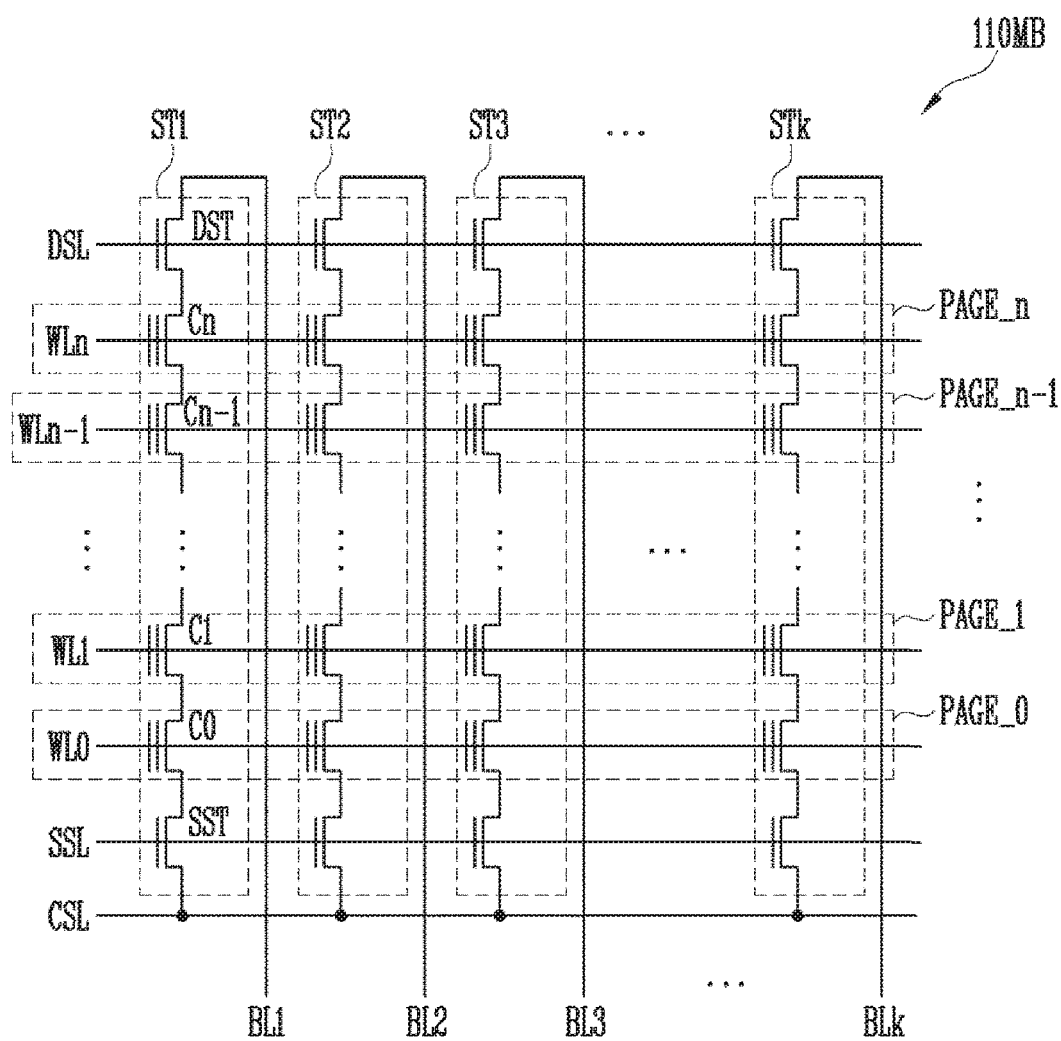
FIG. 2 is a circuit diagram illustrating a configuration any one of the memory blocks of FIG. 1, according to an embodiment of the present invention.

FIG. 2 is a circuit diagram illustrating a configuration of any one of the memory blocks of FIG. 1, according to an embodiment of the present invention.

The memory blocks of FIG. 1 may all have the same configuration; therefore, only one of the memory blocks will be described herein as an example.

Referring to FIG. 2, the memory block 110MB includes a plurality of cell strings ST1 to STk, each string being coupled between a respective bit line among the plurality of bit lines BL1 to BLk and a common source line CSL. For instance, the first string ST1 is coupled between the first bit line BL1 and the common source line CSL, the second string ST2 is coupled between the second bit line BL2 and the common source line CSL, the third string ST3 is coupled between the third bit line and the common source line CSL and so on and so forth with the $k^{th}$ string STk coupled between the $k^{th}$ bit line and common source line CSL.

Since the cell strings ST1 to STk may have the same configuration, only a first cell string among them, for example cell string ST1 will be described herein as an example.

The first cell string ST1 may include a source select transistor SST, a plurality of memory cells C0 to Cn, and a drain select transistor DST which are all coupled in series between the common source line CSL and the first bit line BL1. The gate of each of the source select transistors SST of the plurality of the cell strings ST1 to STm is coupled to the same source select line SSL shared by the strings. The gates of the memory cells C0 to Cn of each of the plurality of the cell strings ST1 to STm are coupled to the same respective word lines WL0 to WLn. For example, the gates of all memory cells C0 of the cell strings are coupled to the WL0 word line to form page PAGE_0, the gates of all memory cells C1 of the cell strings are coupled to the WL1 word line to form page PAGE_1, and so on and so forth with the gates of all the memory cells Cn are coupled to the WLn word line to form page PAGE_n. The gate of each of the drain select transistors DST of the plurality of the cell strings ST1 to STm is coupled to the same drain select line DSL shared by the cell strings.

For instance, the memory block 110MB may include a plurality of pages PAGE_0 to PAGE_n.

Each of the pages is the basic unit of a program or read operation.

Figure 3:
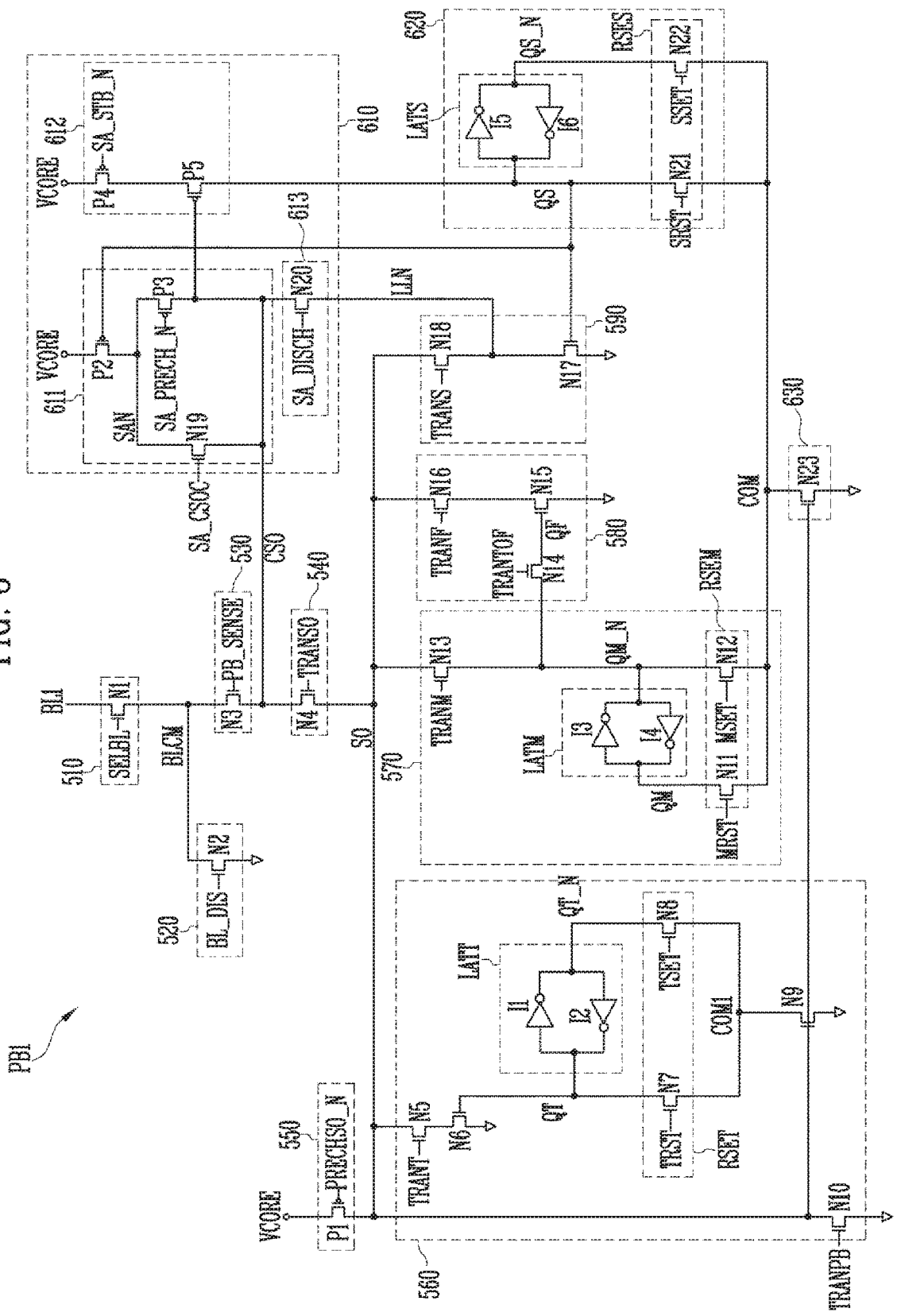
FIG. 3 is a circuit diagram illustrating an example configuration of a page buffer, according to an embodiment of the present invention.

FIG. 3 is a circuit diagram illustrating an example configuration of a page buffer PB1, according to an embodiment of the present invention.

Referring to FIGS. 1 and 3, the page buffers PB1 to PBk may have the same configuration; therefore, only one page buffer, page buffer PB1 will be described herein as an example.

The page buffer PB1 may operate in response to a signal outputted from the control logic 140. The following signals SELBL, PB_SENSE, TRANSO, BL_DIS, SA_PRECH_N, SA_CSOC, SA_STB_N, SA_DISCH, PRECHSO_N, TRANT, TRST, TSET, TRANM, MRST, MSET, TRANTOF, TRANF, TRANS, SRST, SSET, and TRANPB may be included in the signal outputted from the control logic 140. The page buffer PB1 will be described in detail.

The page buffer PB1 may include a bit line coupling unit 510, a bit line discharge unit 520, a page buffer sensing unit 530, a sensing node coupling unit 540, a sensing node precharge unit 550, a cache latch unit 560, a main latch unit 570, a dynamic latch unit 580, a latch detection unit 590, a current control unit 610, a latch circuit unit 620, and a discharge unit 630.

The bit line coupling unit 510 may be coupled between the bit line BL1 and a bit line coupling node BLCM. The bit line coupling unit 510 may include an NMOS transistor N1 which operates in response to a bit line select signal SELBL. The NMOS transistor N1 may be turned on or off in response to the bit line select signal SELBL.

The bit line discharge unit 520 may be coupled between a ground terminal and the bit line coupling node BLCM. The bit line discharge unit 520 may include an NMOS transistor N2 which operates in response to a bit line discharge signal BL_DIS. The NMOS transistor N2 may be turned on or off in response to the bit line discharge signal BL_DIS. The bit line discharge unit 520 may discharge the bit line BL1.

The page buffer sensing unit 530 may be coupled between the bit line coupling node BLCM and a current sensing node CSO. The page buffer sensing unit 530 may include an NMOS transistor N3 which operates in response to a page buffer sensing signal PB_SENSE. The NMOS transistor N3 may be turned on or off in response to the page buffer sensing signal PB_SENSE.

According to the present invention, during a program verify operation of a program operation, the page buffer sensing signal PB_SENSE to be applied to the NMOS transistor N3 may be controlled depending on a program sequence of a selected page of the plurality of pages. For example, the potential level of the page buffer sensing signal PB_SENSE to be applied to the NMOS transistor N3 may be controlled so that the later in the program sequence the selected page is, the higher the potential level is.

Furthermore, during a read operation, the potential level of the page buffer sensing signal PB_SENSE to be applied to the NMOS transistor N3 may be controlled depending on the position of the selected page of the plurality of pages. For example, the potential level of the page buffer sensing signal PB_SENSE to be applied to the NMOS transistor N3 may be reduced as the selected page is disposed closer to the drain select transistor, and may be increased as the selected page is disposed closer to the source select transistor.

Furthermore, during a program verify or a read operation, the enable period of the page buffer sensing signal PB_SENSE to be applied to the NMOS transistor N3 may be controlled. For example, during a program verify operation, the enable period of the page buffer sensing signal PB_SENSE to be applied to the NMOS transistor N3 may be controlled depending on the program sequence of the selected page. For example, during a program verify operation, the later in the program sequence the selected page is, the greater the duration of the enable period of the page buffer sensing signal PB_SENSE to be applied to the NMOS transistor N3*is*. Furthermore, during a read operation, the enable period of the page buffer sensing signal PB_SENSE to be applied to the NMOS transistor N3 may be controlled depending on the position of the selected page. For example, during a read operation, the enable period of the page buffer sensing signal PB_SENSE to be applied to the NMOS transistor N3 is reduced as the selected page of the plurality of pages is disposed closer to the drain select transistor.

In addition, during a bit line precharge operation of a program verify operation, the potential level of the page buffer sensing signal PB_SENSE to be applied to the NMOS transistor N3 may be controlled depending on the program sequence of the selected page. Furthermore, during a bit line precharge operation of a program verify operation, the enable period of the page buffer sensing signal PB_SENSE to be applied to the NMOS transistor N3 may be controlled.

For example, during a bit line precharge operation of a program verify operation, the potential level of the page buffer sensing signal PB_SENSE to be applied to the NMOS transistor N3 may be controlled so that the later in the program sequence the selected page is, the higher the potential level is. In addition, the later in the program sequence the selected page is, the greater the enable period of the page buffer sensing signal PB_SENSE to be applied to the NMOS transistor N3 is. In this case, the potential level and the enable period may be controlled together.

Furthermore, during a bit line precharge operation of a read operation, the potential level of the page buffer sensing signal PB_SENSE to be applied to the NMOS transistor N3 may be controlled depending on the position of a selected page. Furthermore, during the bit line precharge operation of the read operation, the enable period of the page buffer sensing signal PB_SENSE to be applied to the NMOS transistor N3 may be controlled. For example, the potential level of the page buffer sensing signal PB_SENSE to be applied to the NMOS transistor N3 may be controlled to be reduced as the selected page is disposed closer to the drain select transistor, and to be increased as the selected page is disposed closer to the source select transistor. Furthermore, the enable period of the page buffer sensing signal PB_SENSE to be applied to the NMOS transistor N3 may be reduced as the selected page of the plurality of pages is disposed closer to the drain select transistor. In this case, the potential level and the enable period may be controlled together.

Furthermore, during a program verify or a read operation, the potential level of the page buffer sensing signal PB_SENSE to be applied to the NMOS transistor N3 may be controlled depending on the temperature of the memory cell array 110. For example, during the program verify or read operation, the potential level of the page buffer sensing signal PB_SENSE to be applied to the NMOS transistor N3 may be controlled to be increased as the temperature of the memory cell array 110 is reduced, and to be reduced as the temperature of the memory cell array 110 is increased.

The sensing node coupling unit 540 may be coupled between the current sensing node CSO and a sensing node SO. The sensing node coupling unit 540 may include an NMOS transistor N4 which operates in response to a node coupling signal TRANSO. The NMOS transistor N4 may be turned on or off in response to the node coupling signal TRANSO.

The sensing node precharge unit 550 may be coupled between a core voltage (VCORE) terminal and the sensing node SO. The sensing node precharge unit 550 may include a PMOS transistor P1 which operates in response to the precharge signal PRECHSO_N. The PMOS transistor P1 may be turned on or off in response to the precharge signal PRECHSO_N. If the PMOS transistor P1 is turned on in response to the precharge signal PRECHSO_N, a core voltage VCORE is supplied to the sensing node SO.

The cache latch unit 560 may include NMOS transistor N5, N6, N9 and N10, a cache latch LATT and a cache latch reset/setup unit RSET. The cache latch unit 560 may temporarily store program data.

The NMOS transistor N5 may be coupled between the sensing node SO and the NMOS transistor N6 and turned on or off in response to a cache data transfer signal TRANT. The NMOS transistor N6 may be coupled between the NMOS transistor N5 and the ground terminal and turned on or off in response to the potential level of a second cache node QT.

The cache latch LATT may include first and second inverters I1 and I2. The first and second inverters I1 and I2 may be coupled in parallel with each other between first and second cache nodes QT_N and QT of the cache latch LATT. An input terminal of the first inverter I1 may be coupled to the second cache node QT, and an output terminal thereof may be coupled to the first cache node QT_N. An input terminal of the second inverter I2 may be coupled to the first cache node QT_N, and an output terminal thereof may be coupled to the second cache node QT.

The cache latch reset/setup unit RSET may be coupled to the first and second cache nodes QT_N and QT of the cache latch LATT and reset or set up the cache latch LATT. For example, the cache latch reset/setup unit RSET may include NMOS transistors N7 and N8. The NMOS transistor N7 may couple the second cache node QT of the cache latch LATT to a node COM1 in response to a cache reset signal TRST. The NMOS transistor N8 may couple the first cache node QT_N of the cache latch LATT to the node COM1 in response to a cache setup signal TSET.

The NMOS transistor N9 may be coupled between the node COM1 and the ground terminal. The gate of the NMOS transistor N9 is coupled to the sensing node SO. The NMOS transistor N9 may be turned on or off in response to the potential level of the sensing node SO. The NMOS transistor N10 may be coupled between the sensing node SO and the ground terminal and turned on or off in response to a page buffer data transmission signal TRANPB.

The main latch unit 570 may include an NMOS transistor N13, a main latch LATM and a main latch reset/setup unit RSEM. The main latch unit 570 may receive program data and determine an operation. For example, the main latch unit 570 may determine any one of program, read and erase operations.

The NMOS transistor N13 may couple the sensing node SO to a first main node QM_N of the main latch LATM in response to a main data transmission signal TRANM.

The main latch LATM may include third and fourth inverters I3 and I4. The third and fourth inverters I3 and I4 may be coupled in parallel to each other between first and second main nodes QM_N and QM of the main latch LATM. An input terminal of the third inverter I3 may be coupled to the second main node QM, and an output terminal thereof may be coupled to the first main node QM_N. An input terminal of the fourth inverter I4 may be coupled to the first main node QM_N, and an output terminal thereof may be coupled to the second main node QM.

The main latch reset/setup unit RSEM may be coupled to the first and second main nodes QM_N and QM of the main latch LATM and reset or set up the main latch LATM. For example, the main latch reset/setup unit RSEM may include NMOS transistors N11 and N12. The NMOS transistor N11 may couple the second main node QM of the main latch LATM to a common node COM in response to a main reset signal MRST. The NMOS transistor N12 may couple the first main node QM_N of the main latch LATM to the common node COM in response to a main setup signal MSET.

The dynamic latch unit 580 may include NMOS transistors N14, N15 and N16. The dynamic latch unit 580 may store program operation information. For example, the dynamic latch unit 580 may store any one of MLC (Multi Level Cell), TLC (Triple Level Cell) and QLC (Quad Level Cell) program operation information.

The NMOS transistor N14 may couple the first main node QM_N to a dynamic node QF in response to a dynamic data transmission signal TRANTOF. The NMOS transistor N15 may be coupled between the NMOS transistor N16 and the ground terminal and turned on or off in response to the potential of the dynamic node QF. The NMOS transistor N16 may be coupled between the sensing node SO and the NMOS transistor N15 and turned on or off in response to a dynamic data transmission signal TRANF.

The latch detection unit 590 may include NMOS transistors N17 and N18. When a program verify operation or read operation for a plurality of memory cells is performed, the latch detection unit 590 may detect the states of the plurality of memory cells. The NMOS transistor N17 may be coupled between a detection node LLN and the ground terminal. The NMOS transistor N17 may be turned on or off in response to the potential of a second sensing node QS of the latch circuit unit 620. The NMOS transistor N18 may be coupled between the sensing node SO and the detection node LLN. The NMOS transistor N18 may be turned on or off in response to a detection data transmission signal TRANS.

The current control unit 610 may include a clamp circuit unit 611, a current determination circuit unit 612 and a discharge unit 613.

The clamp circuit unit 611 may include an NMOS transistor N19 and PMOS transistors P2 and P3. The PMOS transistor P2 may be coupled between the core voltage (VCORE) terminal and a sense amplifier node SAN and turned on or off in response to the potential of the second sensing node QS. The PMOS transistor P3 may be coupled between the sense amplifier node SAN and the current sensing node CSO and generate current for precharging the bit line BL1 to the current sensing node CSO in response to a current precharge signal SA_PRECH_N. The NMOS transistor N19 may be coupled between the sense amplifier node SAN and the current sensing node CSO and generate current for sensing the bit line BL1 in response to a current sensing signal SA_CSOC. According to the present invention, during a program verify operation or read operation, an operation for controlling the current sensing signal SA_CSOC to be applied to the NMOS transistor N19 may be performed in a manner similar to that of the above-described method of controlling the page buffer sensing signal PB_SENSE to be applied to the NMOS transistor N3; therefore, a detailed description thereof will be omitted.

The current determination circuit unit 612 may include PMOS transistors P4 and P5. The PMOS transistor P4 may be coupled between the core voltage (VCORE) terminal and the PMOS transistor P5 and turned on or off in response to a sense amplifier strobe signal SA_STB_N. According to the present invention, during a program verify operation or a read operation, an enable period of the sense amplifier strobe signal SA_STB_N to be applied to the PMOS transistor P4 may be controlled to be increased or reduced. For example, during a program verify operation, the enable period of the sense amplifier strobe signal SA_STB_N to be applied to the PMOS transistor P4 may be controlled to be increased or reduced depending on a program sequence of a selected page. Furthermore, during the read operation, the enable period of the sense amplifier strobe signal SA_STB_N to be applied to the PMOS transistor P4 may be controlled to be increased or reduced depending on the position of the selected page among the plurality of pages.

In addition, the enable period of the sense amplifier strobe signal SA_STB_N to be applied to the PMOS transistor P4 may be controlled to be increased or reduced depending on the temperature of the memory cell array 110.

The PMOS transistor P5 may be coupled between the PMOS transistor P4 and the second sensing node QS and turned on or off in response to the potential level of the current sensing node CSO.

The sensing discharge unit 613 may be coupled between the current sensing node CSO and the detection node LLN and include an NMOS transistor N20 which operates in response to a sense amplifier discharge signal SA_DISCH. The NMOS transistor N20 may be turned on or off in response to the sense amplifier discharge signal SA_DISCH. The discharge unit 613 may discharge the current sensing node CSO.

The latch circuit unit 620 may include a sensing latch LATS and a sensing latch reset/setup unit RSES. The sensing latch LATS may include fifth and sixth inverters I5 and I6. The fifth and sixth inverters I5 and I6 may be coupled in parallel with each other between first and second sensing nodes QS_N and QS of the sensing latch LATS. For example, an input terminal of the fifth inverter I5 may be coupled to the second sensing node QS, and an output terminal thereof may be coupled to the first sensing node QS_N. An input terminal of the sixth inverter I6 may be coupled to the first sensing node QS_N, and an output terminal thereof may be coupled to the second sensing node QS.

The sensing latch reset/setup unit RSES may be coupled to the first and second sensing nodes QS_N and QS of the sensing latch LATS and reset or set up the sensing latch LATS. For example, the sensing latch reset/setup unit RSES may include NMOS transistors N21 and N22. The NMOS transistor N21 may couple the second sensing node QS of the sensing latch LATS to the common node COM in response to a sensing reset signal SRST. The NMOS transistor N22 may couple the first sensing node QS_N of the sensing latch LATS to the common node COM in response to a sensing setup signal SSET.

The discharge unit 630 may be coupled between the common node COM and the ground terminal, and include an NMOS transistor N23 which is turned on or off depending on the potential of the sensing node SO.

FIG. 4 is a flowchart illustrating a program operation of the semiconductor memory device, according to an embodiment of the present invention.

Referring to FIGS. 1 to 4, a command CMD and an address ADDR are inputted from the outside, and a program operation is sequentially performed for the plurality of pages of the memory cell array 110. The program operation may be performed on a page basis.

In an embodiment, the program operation may be performed in a normal program manner in which the pages are sequentially programmed from the page PAGE_0 to the page PAGE_n according to a program sequence.

One page of the plurality of pages PAGE_0 to PAGE_n is selected according to the program sequence, and a program voltage applying operation for the selected page is performed (at S110). For example, during a program voltage applying operation of the program operation, the page PAGE_0 of the plurality of pages may be selected as the first page. In this case, a program voltage Vpgm may be applied to the page PAGE_0.

Thereafter, a program verify voltage Vverify is applied to the selected page. In this case, the plurality of page buffers PB1 to PBk perform a program verify operation for the selected page in response to a page buffer sensing signal PB_SENSE and a current sensing signal SA_CSOC that correspond to the selected page (at S120). For example, during the program verify operation, if the selected page is the page PAGE_0 the program sequence of which is earliest, the plurality of page buffers PB1 to PBk perform a program verify operation for the page PAGE_0 using a page buffer sensing signal PB_SENSE and a current sensing signal SA_CSOC that correspond to the page PAGE_0. In this case, the potential levels of the page buffer sensing signal PB_SENSE and the current sensing signal SA_CSOC that correspond to the page PAGE_0 may be lowest compared to the potential levels of the page buffer sensing signals PB_SENSE and the current sensing signals SA_CSOC that correspond to the other pages.

When the result of the program verify operation for the selected page (at S130), is determined to be a failure, the program voltage Vpgm is increased, for example, by a step voltage (at S140), and then the program operation is re-performed from step S110. When the result of the program verify operation for the selected page, is determined to be a pass (at S130) It is determined whether the selected page is the last page of the plurality of pages (S150). When it is determined that the selected page is not the last page in the program sequence, a next page following the selected page according to the program sequence is selected, and the potential levels of the page buffer sensing signal PB_SENSE and the current sensing signal SA_CSOC are set to increased values (at S160). That is, the potential levels of the page buffer sensing signal PB_SENSE and the current sensing signal SA_CSOC that correspond to the next page following the selected page are set higher than the potential levels of the page buffer sensing signal PB_SENSE and the current sensing signal SA_CSOC that correspond to the selected page. For example, during the program operation, the page PAGE_0 of the plurality of pages may be selected as the first page according to the program sequence, and the page PAGE_1 of the plurality of pages may be selected as the next page according to the program sequence. In this case, the potential levels of the page buffer sensing signal PB_SENSE and the current sensing signal SA_CSOC that correspond to the page PAGE_1 may be higher than the potential levels of the page buffer sensing signal PB_SENSE and the current sensing signal SA_CSOC that correspond to the page PAGE_0.

Thereafter, if the selected page is set to the last page according to the program sequence, the program operation is ended. For example, according to the program sequence, the page PAGE_n may be selected as the last page. The potential levels of the page buffer sensing signal PB_SENSE and the current sensing signal SA_CSOC that correspond to the page PAGE_n may be highest compared to the potential levels of the page buffer sensing signals PB_SENSE and the current sensing signals SA_CSOC that correspond to the other pages.

In another embodiment, the program operation may be performed in a reverse program manner in which the pages are sequentially programmed in a sequence from the page PAGE_n to the page PAGE_0 according to a program sequence. During the program operation, according to the program sequence, the page PAGE_n of the plurality of pages may be selected as the first page, the page PAGE_n−1 may be selected as the next page, and the page PAGE_0 may be selected as the last page. In this case, during a program verify operation of the program operation, the potential levels of the page buffer sensing signal PB_SENSE and the current sensing signal SA_CSOC that correspond to the page PAGE_n may be lowest compared to the potential levels of the page buffer sensing signals PB_SENSE and the current sensing signals SA_CSOC that correspond to the other pages. Furthermore, during the program verify operation, the potential levels of the page buffer sensing signal PB_SENSE and the current sensing signal SA_CSOC that correspond to the page PAGE_n−1 may be higher than the potential levels of the page buffer sensing signal PB_SENSE and the current sensing signal SA_CSOC that correspond to the page PAGE_n. In addition, during the program verify operation, the potential levels of the page buffer sensing signal PB_SENSE and the current sensing signal SA_CSOC that correspond to the page PAGE_0 may be highest compared to the potential levels of the page buffer sensing signals PB_SENSE and the current sensing signals SA_CSOC that correspond to the other pages.

Therefore, while the program operation is performed, regardless of back patterns of the plurality of memory cells included in the plurality of pages, differences in current characteristics of the memory cells may be improved by controlling the potential levels of the buffer sensing signals PB_SENSE and the current sensing signals SA_CSOC.

FIG. 5 is a flowchart illustrating a program operation and a read operation of the semiconductor memory device, according to an embodiment of the present invention.

Referring to FIGS. 1 to 3 and 5, a command CMD and an address ADDR are inputted from the outside, and a program operation is performed for the plurality of pages of the memory cell array 110 (at S210). The program operation may be performed on a page basis. In an embodiment, the program operation may be performed in a normal program manner in which the pages are sequentially programmed in a sequence from the page PAGE_0 to the page PAGE_n. In another embodiment, the program operation may be performed in a reverse program manner in which the pages are sequentially programmed in a sequence from the page PAGE_n to the page PAGE_0. The program operation may be performed by a method similar to the program operation method described with reference to FIG. 4.

Thereafter, during a read operation, according to the position of a selected page of the plurality of pages, the potential levels of page buffer sensing signals PB_SENSE and current sensing signals SA_CSOC to be applied to the respective page buffers PB1 to PBk may be controlled (at S220). During the read operation, as the selected page of the plurality of pages is disposed closer to the drain select transistor DST, the potential levels of the page buffer sensing signal PB_SENSE and current sensing signal SA_CSOC to be applied thereto may be reduced. For example, when the page PAGE_n of the plurality of pages PAGE_0 to PAGE_n is selected and a read operation for the page PAGE_n is performed, the potential levels of the page buffer sensing signal PB_SENSE and the current sensing signal SA_CSOC to be applied to each of the page buffers PB1 to PBk may be controlled to be lowest compared to the potential levels of the page buffer sensing signals PB_SENSE and the current sensing signals SA_CSOC that correspond to the other pages. Furthermore, when the page PAGE_0 of the plurality of pages PAGE_0 to PAGE_n is selected and a read operation for the page PAGE_0 is performed, the potential levels of the page buffer sensing signal PB_SENSE and the current sensing signal SA_CSOC to be applied to each of the page buffers PB1 to PBk may be controlled to be highest compared to the potential levels of the page buffer sensing signals PB_SENSE and the current sensing signals SA_CSOC that correspond to the other pages.

FIG. 6 is a timing diagram illustrating in detail an operating method of the page buffer illustrated in FIG. 3.

Figure 7:
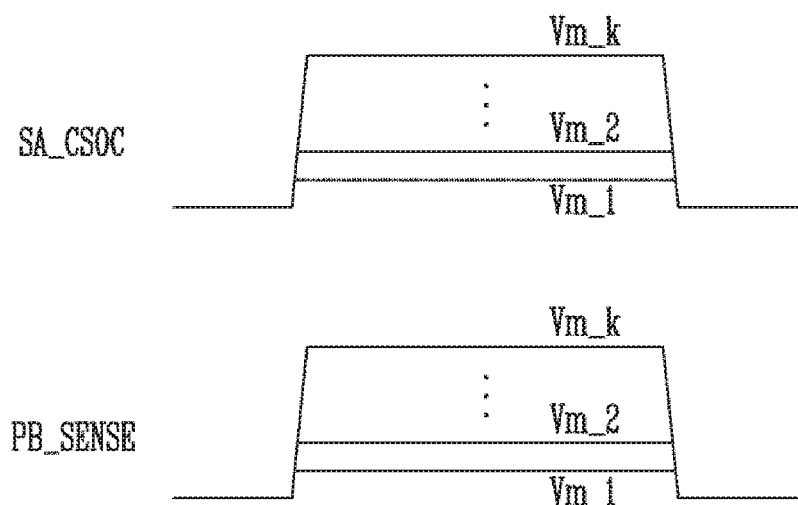
FIG. 7 is a view illustrating a page buffer sensing signal and a current sensing signal, according to an embodiment of the present invention.

FIG. 7 is a view illustrating the page buffer sensing signal and the current sensing signal shown in FIG. 6 according to an embodiment of present invention.

The operation of a page buffer during the program verify operation will be described with reference to FIGS. 1 to 4, 6, and 7.

In the following description, one page buffer (for example, PB1) of the plurality of page buffers PB1 to PBk will be described by way of example.

When the program verify operation starts, a bit line discharge signal BL_DIS is applied as a high logic level in a period from t1 to t2, so the NMOS transistor N2 is turned on, and the bit line BL1 is discharged. In a period from t2 to t3, a pass voltage VPASS is applied to unselected word lines UNSELWL coupled to unselected pages, and a drain select line pass voltage VPADSL and a source select line pass voltage VPASSL are respectively applied to the drain select line DSL and the source select line SSL among the plurality of word lines WL. In this case, the discharge signal is maintained in the high logic level, and the NMOS transistor N2 is thus maintained in the turned-on state. In a period from t3 to t5, a first voltage V1 is applied to a selected word line SELWL coupled to a selected page. In this case, the first voltage V1 may be a program verify voltage Vverify. When the potential of the selected word line SELWL reaches the first voltage V1 (at t4), the bit line discharge signal BL_DIS is transitioned from the high logic level to a low logic level, and the NMOS transistor N2 is thus turned off. At this time, the current precharge signal SA_PRECH_N is transitioned from a high logic level to a low logic level, and the PMOS transistor P3 is turned on. Furthermore, in response to the potential of the second sensing node QS, the PMOS transistor P2 is turned on or off. When the PMOS transistors P2 and P3 are turned on, a core voltage VCORE among internal voltages may be supplied to the current sensing node CSO. In addition, the page buffer sensing signal PB_SENSE and the current sensing signal SA_SCOC are transitioned from a low logic level to a high logic level, and the corresponding NMOS transistors N3 and N19 are thus turned on. The sense amplifier discharge signal SA_DISCH is transitioned from a low logic level to a high logic level. Thus, the NMOS transistor N20 is turned on, and the current sensing node CSO is discharged. Thereafter, in a period from t4 to t5, the precharge sensing node signal PRECHSO_N is transitioned from a low logic level to a high logic level, and the PMOS transistor P1 is turned off, so the core voltage VCORE is not supplied to the sensing node SO.

At a time t5, the current precharge signal SA_PRECH_N is transitioned from a low logic level to a high logic level, and the PMOS transistor P3 is thus turned off. The sense amplifier discharge signal SA_DISCH is transitioned from the high logic level to the low logic level, and the NMOS transistor N20 is thus turned off. Subsequently, a sensing operation is performed.

At the time t5, when the sensing operation starts, the sense amplifier strobe signal SA_STB_N is transitioned from a high logic level to a low logic level, and the PMOS transistor P4 is turned on. For example, during the program verify operation, the enable period of the sense amplifier strobe signal SA_STB_N to be applied to the PMOS transistor P4 may be controlled to be increased or reduced depending on a program sequence of a selected page.

It is assumed that, before the sensing operation is performed, '1' is stored in the second sensing node QS as initialization data. If the PMOS transistor P5 is in a turned-off state, the voltage or current of the current sensing node CSO is not changed, so that data of '1' is maintained in the second sensing node QS. If the PMOS transistor P5 is in a turned-on state, the terminal of the core voltage VCORE among the internal voltages is coupled with the second sensing node QS. In this case, the data of the second sensing node QS is changed to '0' and the sensing operation is ended. If the sensing operation is ended, the sense amplifier strobe signal SA_STB_N is transitioned from the low logic level to the high logic level, and the PMOS transistor P4 is turned off.

At a time t6, the current precharge signal SA_PRECH_N is transitioned from the high logic level to the low logic level, and the PMOS transistor P3 is turned on. Furthermore, in response to the potential of the second sensing node QS, the PMOS transistor P2 is turned on or off. When the PMOS transistors P2 and P3 are turned on, the core voltage VCORE among the internal voltages may be supplied to the current sensing node CSO. In addition, the sense amplifier discharge signal SA_DISCH is transitioned from the low logic level to the high logic level, and the NMOS transistor N20 is thus turned on.

In a period from t7 to t11, a second voltage V2 is applied to the selected word line SELWL. The second voltage V2 may be a program verify voltage Vverify higher than the first voltage V1.

In a period from t10 to t11, the page buffer sensing signal PB_SENSE and the current sensing signal SA_SCOC are transitioned from the high logic level to the low logic level, and the corresponding NMOS transistors N3 and N19 are thus turned off.

The potential level of the page buffer sensing signal PB_SENSE and the potential level of the current sensing signal SA_CSOC in a period from t4 to t11 during the program verify operation will be described in more detail below.

During the program verify operation, the potential levels of the page buffer sensing signal PB_SENSE and current sensing signal SA_CSOC to be respectively applied to the NMOS transistor N3 and the NMOS transistor N19 may be controlled depending on the program sequence of the selected page among the plurality of pages. For example, the potential levels of the page buffer sensing signal PB_SENSE and current sensing signal SA_CSOC to be respectively applied to the NMOS transistor N3 and the NMOS transistor N19 may be controlled so that the later in the program sequence the selected page is, the higher the potential levels are. In this case, the page buffer sensing signal PB_SENSE and the current sensing signal SA_CSOC may be applied at the same timing, or the current sensing signal SA_CSOC may be applied prior to the page buffer sensing signal PB_SENSE. The potential level of the page buffer sensing signal PB_SENSE and the potential level of the current sensing signal SA_CSOC may be the same as each other.

In an embodiment, the program operation may be performed in the normal program manner in which the pages are sequentially selected and programmed in a sequence from the page PAGE_0 to the page PAGE_n according to the program sequence. The program operation may be performed on a page basis.

For instance, during the program verify operation of the program operation, the potential level of page buffer sensing signal PB_SENSE and the current sensing signal SA_CSOC may be raised from the page PAGE_0 having the first program turn among the plurality of pages to the page PAGE_n having the last program turn. The potential level of each of the page buffer sensing signal PB_SENSE and current sensing signal SA_CSOC may be any one of first to k-th bit line sensing voltages Vm_1 to Vm_k.

During the program verify operation, if the page PAGE_0 having the first program turn is selected among the plurality of pages, the potential level of each of the page buffer sensing signal PB_SENSE and current sensing signal SA_CSOC may become the first bit line sensing voltage Vm_1.

According to the program sequence, the first bit line sensing voltage Vm_1 may be the lowest potential level among the potential levels of the page buffer sensing signal PB_SENSE and current sensing signal SA_CSOC.

During the program verify operation, if the page PAGE_1 having the second program turn is selected among the plurality of pages, the potential level of each of the page buffer sensing signal PB_SENSE and current sensing signal SA_CSOC may become the second bit line sensing voltage Vm_2 higher than the first bit line sensing voltage Vm_1. If the page PAGE_n having the last program turn is selected among the plurality of pages, the potential level of each of the page buffer sensing signal PB_SENSE and current sensing signal SA_CSOC may become the k-th bit line sensing voltage Vm_k. During the program verify operation, according to the program sequence, the k-th bit line sensing voltage Vm_k may be at the highest potential level among the potential levels of the page buffer sensing signal PB_SENSE and current sensing signal SA_CSOC. That is, during the program verify operation, the potential levels of the page buffer sensing signal PB_SENSE and current sensing signal SA_CSOC may be controlled so that the later in the program sequence of the selected page among the plurality of pages is, the higher the potential levels are.

In another embodiment, the program operation may be performed in the reverse program manner in which the pages are sequentially programmed in a sequence from the page PAGE_n to the page PAGE_0 according to a program sequence. The program operation may be performed on a page basis. For instance, during the program verify operation of the program operation, the page buffer sensing signal PB_SENSE and current sensing signal SA_CSOC may be increased in potential level from the page PAGE_n having the first program turn among the plurality of pages to the page PAGE_0 having the last program turn. The potential level of each of the page buffer sensing signal PB_SENSE and the current sensing signal SA_CSOC may be any one of first to k-th bit line sensing voltages Vm_1 to Vm_k.

For example, during the program verify operation, if the page PAGE_n having the first program turn is selected among the plurality of pages, the potential level of each of the page buffer sensing signal PB_SENSE and the current sensing signal SA_CSOC may become the first bit line sensing voltage Vm_1. According to the program sequence, the first bit line sensing voltage Vm_1 may be the lowest potential level among the potential levels of the page buffer sensing signal PB_SENSE and the current sensing signal SA_CSOC.

During the program verify operation, if the page PAGE_n−1 having the second program turn is selected among the plurality of pages, the potential level of each of the page buffer sensing signal PB_SENSE and current sensing signal SA_CSOC may become the second bit line sensing voltage Vm_2 higher than the first bit line sensing voltage Vm_1. If the page PAGE_0 having the last program turn is selected among the plurality of pages, the potential level of each of the page buffer sensing signal PB_SENSE and current sensing signal SA_CSOC may become the k-th bit line sensing voltage Vm_k.

During the program verify operation, according to the program sequence, the k-th bit line sensing voltage Vm_k may be at the highest potential level among the potential levels of the page buffer sensing signal PB_SENSE and the current sensing signal SA_CSOC. That is, during the program verify operation, the potential levels of the page buffer sensing signal PB_SENSE and current sensing signal SA_CSOC may be controlled so that the later in the program sequence of the selected page among the plurality of pages is, the higher the potential levels are.

If a time t11 has passed, the second voltage V2 that has been applied to the selected word line SELWL is gradually reduced and discharged.

At a time t12, the precharge sensing node signal PRECH-SO_N is transitioned from the high logic level to the low logic level. Thus, the PMOS transistor P1 is turned on, and the core voltage VCORE is supplied to the sensing node SO.

In a period from t12 to t13, the pass voltage VPASS that has been applied to the unselected word lines UNSELWL is gradually reduced and discharged, and the drain select line pass voltage VPADSL and the source select line pass voltage VPASSL that have been respectively applied to the drain select line DSL and the source select line SSL are gradually reduced and discharged.

At a time t14, the discharge signal BL_DIS is transitioned from the low logic level to the high logic level. Thus, the NMOS transistor N2 is turned on, and the bit lie BL1 is discharged.

In addition, during the program verify operation, the enable period of the page buffer sensing signal PB_SENSE and the current sensing signal SA_CSOC may be controlled. For example, during the program verify operation, the enable period of the page buffer sensing signal PB_SENSE and the current sensing signal SA_CSOC may be controlled depending on the program sequence of the selected page. In detail, during the program verify operation, the later in the program sequence of the selected page is, the greater the enable period of the page buffer sensing signal PB_SENSE and the current sensing signal SA_CSOC may be. In this case, the enable period may be a period from t4 to t11.

Furthermore, during the bit line precharge operation of the program verify operation, the potential levels of the page buffer sensing signal PB_SENSE and current sensing signal SA_CSOC may be controlled depending on the program sequence of the selected page. In addition, during the bit line precharge operation of the program verify operation, the enable period of the page buffer sensing signal PB_SENSE and the current sensing signal SA_CSOC may be controlled.

For example, during the bit line precharge operation of the program verify operation, the potential levels of the page buffer sensing signal PB_SENSE and current sensing signal SA_CSOC may be controlled so that the later in the program sequence the selected page is, the higher the potential levels are. Furthermore, the later in the program sequence the selected page is, the greater the enable period of the page buffer sensing signal PB_SENSE and the current sensing signal SA_CSOC may be. In this case, the potential levels and the enable periods may be controlled together.

Further, during the program verify operation, the potential levels of the page buffer sensing signal PB_SENSE and current sensing signal SA_CSOC may be controlled depending on the temperature of the memory cell array 110. For example, during the program verify operation, the potential levels of the page buffer sensing signal PB_SENSE and current sensing signal SA_CSOC may be controlled to increase as the temperature of the memory cell array 110 is reduced, and to reduce as the temperature of the memory cell array 110 is increased. In addition, the enable period of the sense amplifier strobe signal SA_STB_N may be controlled to increase or reduce depending on the temperature of the memory cell array 110.

The operation of a page buffer during the read operation will be described with reference to FIGS. 1 to 3 and 5 to 7.

During the read operation, other than the operation pertaining to the potential levels of the page buffer sensing signal PB_SENSE and current sensing signal SA_SCOC in the period from t4 to t11 and the operation pertaining to the sense amplifier strobe signal SA_STB_N at the time t5, the other signals and voltages are applied in a manner similar to those of the above-described program verify operation; therefore, detailed description thereof will be omitted.

During the read operation, each of the first voltage V1 and the second voltage V2 may be a read voltage Vread.

During the read operation, at the time point t5, when the sensing operation starts, the sense amplifier strobe signal SA_STB_N is transitioned from the high logic level to the low logic level, and the PMOS transistor P4 is turned on. For example, during the read operation, the enable period of the sense amplifier strobe signal SA_STB_N applied to the PMOS transistor P4 may be controlled to increase or reduce depending on the position of the selected page among the plurality of pages.

The potential level of the page buffer sensing signal PB_SENSE and the potential level of the current sensing signal SA_CSOC in the period from t4 to t11 during the read operation will be described in more detail below.

During the read operation, the potential level of the page buffer sensing signal PB_SENSE and the potential level of the current sensing signal SA_SCOC may be controlled depending on the position of the selected page of the plurality of pages. In this case, the page buffer sensing signal PB_SENSE and the current sensing signal SA_CSOC may be applied with the same timing, or the current sensing signal SA_CSOC may be applied prior to the page buffer sensing signal PB_SENSE. The potential level of the page buffer sensing signal PB_SENSE and the potential level of the current sensing signal SA_CSOC may be the same as each other.

During the read operation, the potential levels of the page buffer sensing signal PB_SENSE and current sensing signal SA_CSOC may be controlled to reduce as the selected page of the plurality of pages is disposed closer to the drain select transistor DST, and controlled to increase as the selected page is disposed closer to the source elect transistor SST. The potential level of each of the page buffer sensing signal PB_SENSE and current sensing signal SA_CSOC may be any one of first to k-th bit line sensing voltages Vm_1 to Vm_k.

For example, during the read operation, if the page PAGE_n that is closest to the drain select transistor DST is selected among the plurality of pages, the potential level of each of the page buffer sensing signal PB_SENSE and current sensing signal SA_CSOC may become the first bit line sensing voltage Vm_1. During the read operation, the first bit line sensing voltage Vm_1 may be the lowest potential level among the potential levels of the page buffer sensing signal PB_SENSE and current sensing signal SA_CSOC. During the read operation, if the page PAGE_n-1 that is second closest to the drain select transistor DST is selected among the plurality of pages, the potential level of each of the page buffer sensing signal PB_SENSE and current sensing signal SA_CSOC may become the second bit line sensing voltage Vm_2 higher than the first bit line sensing voltage Vm_1. During the read operation, if the page PAGE_0 that is farthest to the drain select transistor DST is selected among the plurality of pages, the potential level of each of the page buffer sensing signal PB_SENSE and current sensing signal SA_CSOC may become the k-th bit line sensing voltage Vm_k. During the read operation, the k-th bit line sensing voltage Vm_k may be at the highest potential level among the potential levels of the page buffer sensing signal PB_SENSE and current sensing signal SA_CSOC. That is, during the read operation, the closer the selected page is to the drain select transistor DST, the lower the potential levels of the page buffer sensing signal PB_SENSE and the current sensing signal SA_CSOC may be.

In addition, during the read operation, the enable period of the page buffer sensing signal PB_SENSE and the current sensing signal SA_CSOC may be controlled. For example, during the read operation, the enable period of the page buffer sensing signal PB_SENSE and the current sensing signal SA_CSOC may be controlled depending on the position of the selected page. In detail, during the read operation, the closer the position of the selected page among the plurality of pages is to the drain select transistor DST, the less the enable period of the page buffer sensing signal PB_SENSE and the current sensing signal SA_CSOC may be. In this case, the enable period may be the period from t4 to t11.

Furthermore, during the bit line precharge operation of the read operation, the potential level of the page buffer sensing signal PB_SENSE may be controlled depending on the position of the selected page. In addition, during the bit line precharge operation of the read operation, the enable period of the page buffer sensing signal PB_SENSE may be controlled. For example, during the bit line precharge operation of the read operation, the potential level of the page buffer sensing signal PB_SENSE may be controlled to reduce as the position of the selected page is disposed closer to the drain select transistor DST, and to increase as the position of the selected page is disposed closer to the source select transistor SST. Furthermore, the closer the selected page of the plurality of pages is to the drain select transistor DST, the less the enable period of the page buffer sensing signal PB_SENSE may be.

Further, during the read operation, the potential levels of the page buffer sensing signal PB_SENSE and current sensing signal SA_CSOC may be controlled depending on the temperature of the memory cell array 110. For example, during the read operation, the potential levels of the page buffer sensing signal PB_SENSE and current sensing signal SA_CSOC may be controlled to increase as the temperature of the memory cell array 110 is reduced, and to reduce as the temperature of the memory cell array 110 is increased.

As described above, during the program verify operation or read operation, the potential levels of the page buffer sensing signal PB_SENSE and current sensing signal SA_CSOC applied to a page buffer may be controlled depending on the program sequence of the selected page, the position of the selected page or the temperature of the memory cell array. Furthermore, during the program verify operation or read operation, the enable period of the page buffer sensing signal PB_SENSE and current sensing signal SA_CSOC applied to the page buffer may be controlled depending on the program sequence of the selected page or the position of the selected page. Thereby, differences in current characteristics due to differences in back patterns of the plurality of memory cells may be improved, and a distribution shifting and widening phenomenon of the memory may be mitigated. In addition, during the bit line precharge operation of the program verify operation or read operation, the potential level or enable period of the page buffer sensing signal PB_SENSE applied to the page buffer may be controlled depending on the program sequence or position of the selected page. Further, the enable period of the sense amplifier strobe signal SA_STB_N may be controlled to increase or reduce depending on the program sequence, position of the selected page or the temperature of the memory cell array.

Figure 8:
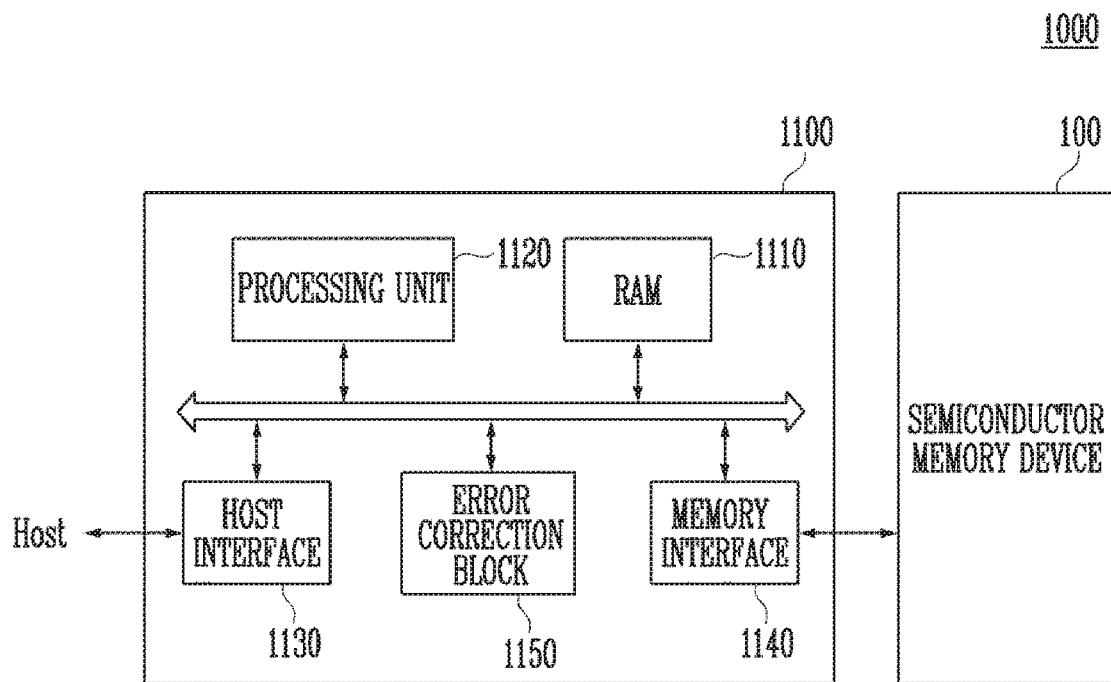
FIG. 8 is a block diagram showing a memory system including the semiconductor memory device of FIG. 1, according to an embodiment of the present invention.

FIG. 8 is a block diagram illustrating a memory system 1000 including the semiconductor memory device 100 of FIG. 1.

Referring FIG. 8, the memory system 1000 includes the semiconductor memory device 100 and a controller 1100.

The semiconductor memory device 100 may have the same configuration and operation as those of the semiconductor memory device described with reference to FIG. 1. Hereinafter, repetitive descriptions will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a Random Access Memory (RAM) 1110, a processing unit 1120, a host interface 1130, a memory interface 1140, and an error correction block 1150 coupled together via an internal bus. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 may control the overall operation of the controller 1100. In addition, the controller 1100 may temporarily store program data provided from the host Host during the write operation.

The host interface 1130 includes a protocol for performing data exchange between the host Host and the controller 1100. In an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an embodiment, the error correction block may be provided as an element of the controller 1100.

The controller 1100 and the semiconductor memory device 100 may be integrated into a single semiconductor device. In an embodiment, the controller 1100 and the semiconductor memory device 100 may be integrated into a single semiconductor device to form a memory card. For example, the controller 1100 and the semiconductor memory device 100 may be integrated into a single semiconductor device and form a memory card, such as a personal computer memory card international association (PCMCIA), a compact flash card (CF), a smart media card (SM or SMC), a memory stick multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 2000 may be phenomenally improved.

In another embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the semiconductor memory device 100 or the memory system 1000 may be embedded in various packages including, for example, Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), or the like.

Figure 9:
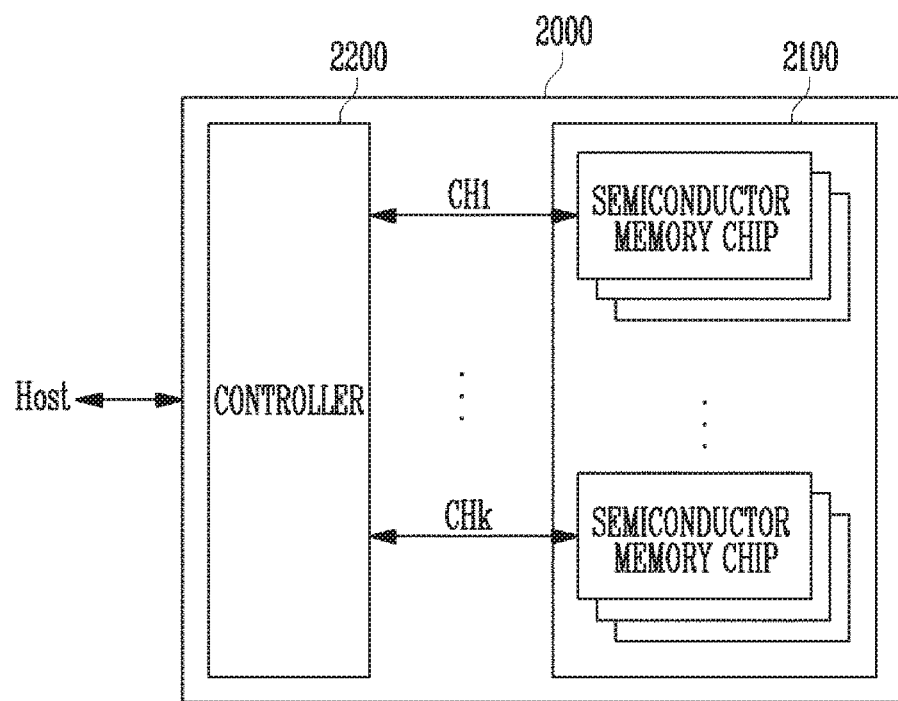
FIG. 9 is a block diagram showing an application example of the memory system of FIG. 8, according to an embodiment of the present invention.

FIG. 9 is a block diagram illustrating an application example of the memory system of FIG. 8.

Referring to FIG. 9, the memory system 2000 includes the semiconductor memory device 2100 and a controller 2200. The semiconductor memory device 2100 includes a plurality of memory chips. The semiconductor memory chips are divided into a plurality of groups.

In FIG. 9, it is illustrated that the respective groups communicate with the controller 2200 through first to k-th channels CH1 to CHk. Each semiconductor memory chip may have the same configuration and operation as those of an embodiment of the semiconductor memory device 100 described with reference to FIG. 1.

Each group communicates with the controller 2200 through one common channel. The controller 2200 may have the same configuration as that of the controller 1100 described with reference to FIG. 8 and may be configured to control a plurality of memory chips of the semiconductor memory device 2100 through the plurality of channels CH1 to CHk.

Figure 10:
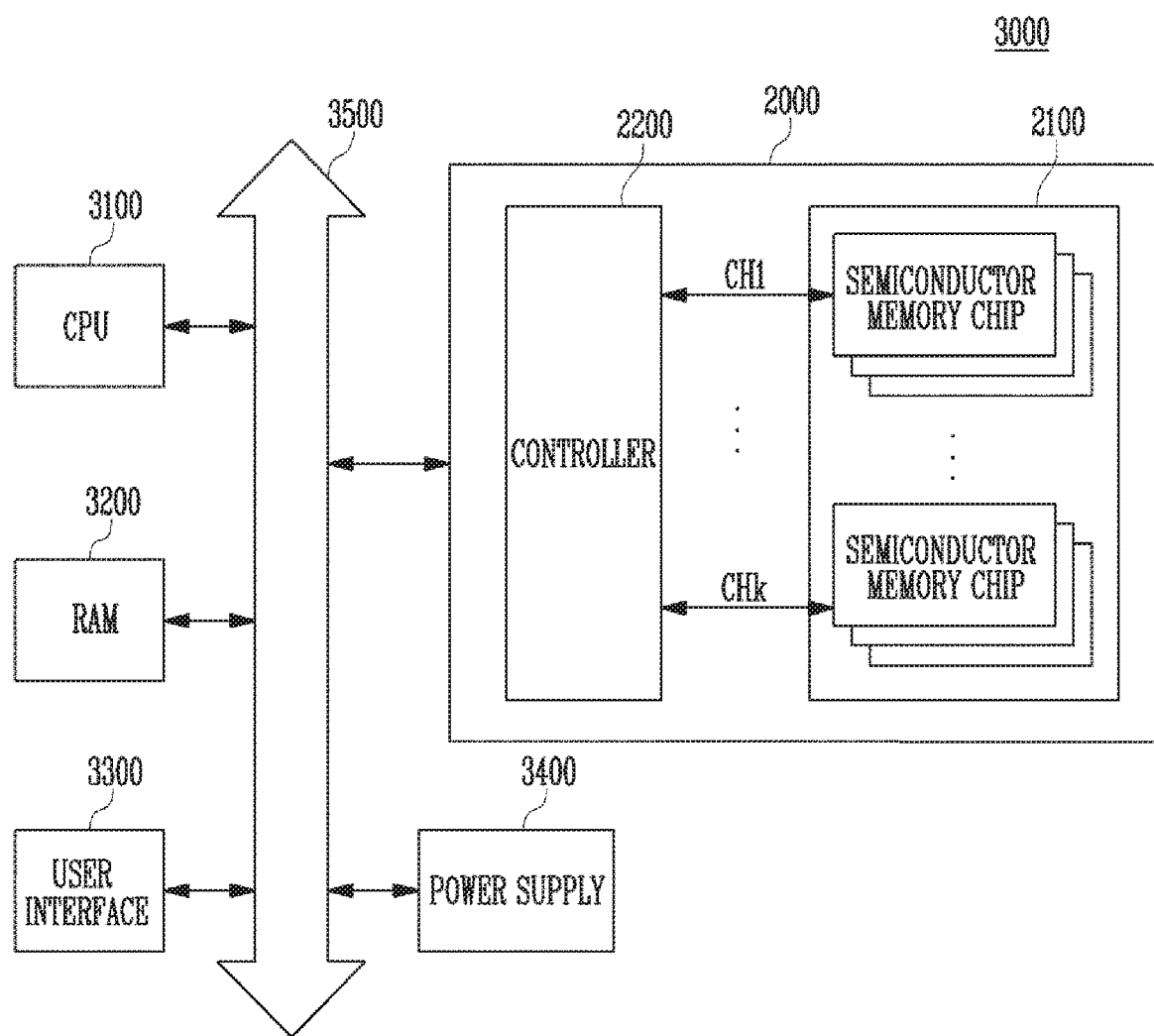
FIG. 10 is a block diagram showing a computing system including the memory system illustrated with reference to FIG. 9, according to an embodiment of the present invention.

FIG. 10 is a block diagram illustrating a computing system including the memory system illustrated with reference to FIG. 9, according to an embodiment of the present invention.

Referring to FIG. 10, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 10, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 10, the memory system 2000 described with reference to FIG. 9 is illustrated as being used. However, the memory system 2000 may be replaced with the memory system 1000 described with reference to FIG. 8. In an embodiment, the computing system 3000 may employ both of the memory systems 1000 and 2000 described with reference to FIGS. 9 and 8.

According to the present invention, differences in current characteristics of memory cells and the reliability of the operation can be improved by controlling the potential level of a page buffer sensing signal to be applied to a page buffer included in the semiconductor memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device comprising:
a memory cell array including a plurality of pages;
a voltage supply unit suitable for providing operating voltages to the plurality of pages;
a plurality of page buffers coupled to a plurality of bit lines of the memory cell array and suitable for controlling and sensing currents flowing through the plurality of bit lines in response to a page buffer sensing signal; and
a control logic suitable for controlling, during a read operation, a potential level of the page buffer sensing signal depending on a temperature of the memory cell array,
wherein the control logic controls an enable period of the page buffer sensing signal depending on the temperature of the memory cell array.

2. The semiconductor memory device according to claim 1, wherein the control logic controls the enable period of the page buffer sensing signal so that, as the temperature of the memory cell array is reduced, the enable period of the page buffer sensing signal is increased.

3. The semiconductor memory device according to claim 1, wherein each of the plurality of page buffers comprises:
a page buffer sensing unit to which the page buffer sensing signal is applied;
a clamp circuit unit coupled to the page buffer sensing unit through a current sensing node; and
a current determination circuit unit suitable for receiving an internal voltage and controlling a current to be outputted in response to a potential level of the current sensing node,
wherein the current determination circuit unit comprises a strobe switching unit suitable for receiving the internal power and controlling the current, and controlling an enable period of a sense amplifier strobe signal to be applied to the strobe switching unit depending on the temperature of the memory cell array.

4. The semiconductor memory device according to claim 1, wherein during a bit line precharge operation of the read operation, the control logic controls the potential level of the page buffer sensing signal and an enable period of the page buffer sensing signal so that, as temperature of the memory cell array is reduced, the potential level of the page buffer sensing signal is raised and the enable period of the page buffer sensing signal is increased.

5. The semiconductor memory device according to claim 1, wherein the control logic controls the potential level of the page buffer sensing signal depending on a position of a selected page among the plurality of pages.

6. The semiconductor memory device according to claim 5, wherein the control logic controls the potential level of the page buffer sensing signal so that, as the position of the selected page is closer to a drain select transistor, the potential level of the page buffer sensing signal is lowered.

* * * * *